United States Patent
Horng et al.

(10) Patent No.: US 7,750,421 B2
(45) Date of Patent: Jul. 6, 2010

(54) HIGH PERFORMANCE MTJ ELEMENT FOR STT-RAM AND METHOD FOR MAKING THE SAME

(75) Inventors: Cheng T. Horng, San Jose, CA (US); Ru-Ying Tong, Los Gatos, CA (US); Chyu-Jiuh Torng, Pleasanton, CA (US); Witold Kula, Cupertino, CA (US)

(73) Assignee: MagIC Technologies, Inc., Milpitas, CA (US)

( * ) Notice: Subject to any disclaimer, the term of this patent is extended or adjusted under 35 U.S.C. 154(b) by 158 days.

(21) Appl. No.: 11/880,583

(22) Filed: Jul. 23, 2007

(65) Prior Publication Data

US 2009/0027810 A1    Jan. 29, 2009

(51) Int. Cl.
*H01L 29/82* (2006.01)

(52) U.S. Cl. .............. 257/421; 257/E21.665; 257/E29.167; 257/E29.323; 365/158

(58) Field of Classification Search .......... 257/421, 257/E29.167, E29.323, E21.665; 365/158, 365/171, 173

See application file for complete search history.

(56) References Cited

U.S. PATENT DOCUMENTS

| | | | |
|---|---|---|---|
| 5,695,864 | A | 12/1997 | Slonczewski |
| 6,181,537 | B1 * | 1/2001 | Gill .................. 360/324.2 |
| 6,958,927 | B1 | 10/2005 | Nguyen et al. |
| 6,967,863 | B2 | 11/2005 | Huai |
| 7,006,375 | B2 | 2/2006 | Covington |
| 7,106,624 | B2 | 9/2006 | Huai et al. |
| 7,126,202 | B2 | 10/2006 | Huai et al. |
| 7,276,384 | B2 * | 10/2007 | Parkin et al. ............ 438/3 |
| 2006/0128038 | A1 | 6/2006 | Pakala et al. |
| 2006/0256484 | A1 * | 11/2006 | Sato et al. ............ 360/324.2 |
| 2007/0076469 | A1 | 4/2007 | Ashida et al. |
| 2007/0086120 | A1 | 4/2007 | Shimazawa et al. |
| 2007/0278547 | A1 * | 12/2007 | Pietambaram et al. ...... 257/296 |
| 2008/0299679 | A1 * | 12/2008 | Zhao et al. ............. 438/3 |

OTHER PUBLICATIONS

"Current-Driven Excitation of Magnetic Multilayers", by J. C. Slonczewski, Jrnl. of Magnetism and Magnetic Materials 159 (1996) L1-L7.

(Continued)

*Primary Examiner*—Anh Phung
*Assistant Examiner*—Allison P Bernstein
(74) *Attorney, Agent, or Firm*—Saile Ackerman LLC; Stephen B. Ackerman (57) ABSTRACT

A STT-MTJ MRAM cell that utilizes transfer of spin angular momentum as a mechanism for changing the magnetic moment direction of a free layer includes an IrMn pinning layer, a SyAP pinned layer, a naturally oxidized, crystalline MgO tunneling barrier layer that is formed on an Ar-ion plasma smoothed surface of the pinned layer and, in one embodiment, a free layer that comprises an amorphous layer of $Co_{60}Fe_{20}B_{20}$ of approximately 20 angstroms thickness formed between two crystalline layers of Fe of 3 and 6 angstroms thickness respectively or on a single such layer. The free layer is characterized by a low Gilbert damping factor and by very strong polarizing action on conduction electrons. The resulting cell has a low critical current, a high dR/R and a plurality of such cells will exhibit a low variation of both resistance and pinned layer magnetization angular dispersion.

7 Claims, 5 Drawing Sheets

OTHER PUBLICATIONS

"230% Room-Temperature Magnetoresistance in CoFeB/Mg$^O$/CoFeB Magnetic Tunnel Junctions", by David D. Djayapravira et al., Applied Phys. Letters 86, 092502 (2005)-3.

"Current-Driven Magnetization Switching in CoFeB/MgO/CoFeB Magnetic Tunnel Junctions", Japanese Jrnl of Appl. Phys., vol. 44, No. 41, 2005, pp. L1267-L1270.

"Spin Transfer Switching Current Reduction in Magnetic Tunnel Junction Based Dual Spin Filter Structures", by Yiming Haai et al., Appl. Phys. Letters 87, 222510 (2005) L-3.

"Study of the Dynamic Magnetic Properties of Soft CoFeB Films", by C. Bilzer et al., Jrnl of Applied Phys. 100, 053903 (2006) 1-4.

"Magnetic Damping in Ferromagnetic Thin Film", by Mikihiko Oogase et al., 2006 The Japan Society of Appl. Physics, Magnetization Dynamics in Spintronic Structures and Devices, V. 45, p. 3889.

"Spin-Current Interaction with a Monodomain Magnetic Body: A Model Study", by J. Z. Sun, Phys. Review B, vol. 62, No. 1, Jul. 1, 2000-I, pp. 570-578.

"Magnetic and Electrical Properties of Magnetic Tunnel Junctions with Radical Oxidized MgO Barriers", by S. C. Oh et al., IEEE Trans. on Mag., vol. 42, No. 10, Oct. 2006, pp. 2642-2644.

"Excellent Scalability and Switching Characteristics in Spin-Transfer Torque MRAM", by S. C. Oh et al., IEDM 2006 288.i.jpg pp. 1-3.

"A Novel Nonvolatile Memory with Spin Torque Transfer Magnetization Switching: Spin-RAM", by M. Hosomi et al., 2005 IEDM Paper 9-1.

* cited by examiner

| Row | Buffer L | Pinning | AP1 | PT(20W,50sccm) | NOX | FL |
|---|---|---|---|---|---|---|
| 1 | NiCr45 | MnPt150 | CoFeB15/CoFe6 | 0 | (1 torr, 1sim)300s | CoFeB25 |
| 2 | | | CoFeB15/CoFe7 | 120" | | Fe3/CoFeB20 |
| 3 | NiCr45/Ru20 | MnIr70 | CoFeB15/CoFe6 | 0 | (1 torr, 1sim)300s | Fe3/CoFeB20 |
| 4 | | | CoFeB15/CoFe7 | 120" | | Fe3/CoFeB20 |
| 5 | | | CoFeB15/CoFe7.5 | 180" | | Fe3/CoFeB20 |
| 6 | | | CoFeB15/CoFe7.5 | 240" | | Fe3/CoFeB20 |
| 7 | | | CoFeB15/CoFe7 | 120" | | Fe3/CoFeB10/Fe6 |

| Row | RA | MR | Bs | Hc | He | Hk |
|---|---|---|---|---|---|---|
| 1 | 9.7 | 103 | 0.59 | 11.0 | 3.73 | 34.2 |
| 2 | 8.3 | 113 | 0.62 | 12.0 | 2.48 | 30.3 |
| 3 | 7.8 | 118 | 0.62 | 12.1 | 7.50 | 34.2 |
| 4 | 8.3 | 127 | 0.62 | 11.9 | 4.41 | 32.2 |
| 5 | 7.7 | 129 | 0.62 | 11.9 | 2.85 | 29.3 |
| 6 | 7.6 | 126 | 0.62 | 11.5 | 1.47 | 28.5 |
| 7 | 8.8 | 125 | 0.65 | 12.5 | 3.08 | 29.5 |

FIG. 4

(a) MnPt        (b) MnIr

HIGH PERFORMANCE MTJ ELEMENT FOR STT-RAM AND METHOD FOR MAKING THE SAME

BACKGROUND OF THE INVENTION

1. Field of the Invention

This invention relates generally to a current perpendicular to plane (CPP) magnetic random access memory (CPP-MRAM) cell formed using a magnetic tunneling junction (MTJ) as the basic memory element, wherein a spin torque transfer (STT) effect is used to change the magnetization direction of the MTJ ferromagnetic free layer.

2. Description of the Related Art

The conventional magnetic tunneling junction (MTJ) device is a form of ultra-high magnetoresistive device in which the relative orientation of the magnetic moments of parallel, vertically separated, upper and lower magnetized layers controls the flow of spin-polarized electrons tunneling through a very thin dielectric layer (the tunneling barrier layer) formed between those layers. When injected electrons pass through the upper layer they are spin polarized by interaction with the magnetic moment of that layer. The majority of the electrons emerge polarized in the direction of the magnetic moment of the upper layer, the minority being polarized opposite to that direction. The probability of such a polarized electron then tunneling through the intervening tunneling barrier layer into the lower layer then depends on the availability of states within the lower layer that the tunneling electron can occupy. This number, in turn, depends on the magnetization direction of the lower electrode. The tunneling probability is thereby spin dependent and the magnitude of the current (tunneling probability times number of electrons impinging on the barrier layer) depends upon the relative orientation of the magnetizations of magnetic layers above and below the barrier layer. The MTJ device can therefore be viewed as a kind of multi-state resistor, since different relative orientations (e.g. parallel and antiparallel) of the magnetic moments will change the magnitude of a current passing through the device. In a common type of device configuration (spin filter), one of the magnetic layers has its magnetic moment fixed in direction (pinned) by exchange coupling to an antiferromagnetic (AFM) layer, while the other magnetic layer has its magnetic moment free to move (the free layer). The magnetic moment of the free layer is then made to switch its direction from being parallel to that of the pinned layer, whereupon the tunneling current is large, to being antiparallel to the pinned layer, whereupon the tunneling current is small. Thus, the device is effectively a two-state resistor. The switching of the free layer moment direction (writing) is accomplished by external magnetic fields that are the result of currents passing through conducting lines adjacent to the cell. Once the cell has been written upon, the circuitry must be able to detect whether the cell is in its high or low resistance state, which is called the "read" process. This process must both measure the resistance of the written-upon cell and then compare that resistance to that of a reference cell in a fixed resistance state, to determine if the written-upon cell is in its high or low state. Needless to say, this process also introduces some statistical difficulties associated with the variation of resistances of the cells.

Figure 1:
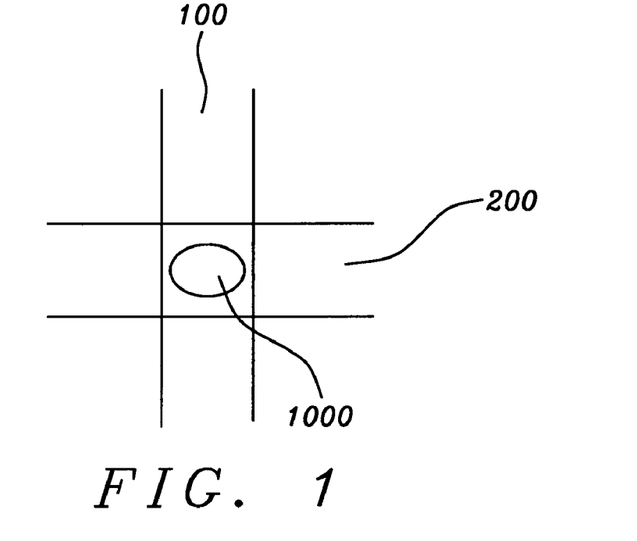
FIG. 1 is a schematic representation of a prior-art MTJ MRAM device located at the junction of word and bit lines.

FIG. 1 is a highly schematic drawing showing an overhead view of a conventional MRAM cell comprising an MTJ cell element (1000) positioned between (or at the intersection of) vertically separated orthogonal word (200) and bit (100) lines. The cell element (1000) is drawn with a slightly elliptical horizontal cross-section because such an anisotropic shape ("shape anisotropy") produces a corresponding magnetic anisotropy within the free layer that assists its magnetic moment in retaining a thermally stable fixed position after switching fields have been turned off. The direction along the free layer in which it is energetically favorable for the moment to remain in and from which it should be difficult to switch the magnetic moment unintentionally (as with thermal effects), the longer direction in this case, is called the "easy axis" of the layer. The axis perpendicular to the easy axis is called the "hard axis." The fields produced by currents in each of the two lines are between about 30 to 60 Oersteds in magnitude. According to the diagram, the word line field will be along the easy axis of the cell element, the bit line field will be along the easy axis.

The use of magnetic fields externally generated by current carrying lines (as in FIG. 1) to switch the magnetic moment directions becomes problematic as the size of the MRAM cells decreases and, along with their decrease, so must the width of the current carrying lines. The smaller width lines require greater currents to produce the necessary switching fields, greatly increasing power consumption.

For this reason, a new type of magnetic device, called a spin transfer device, described by Slonczewski, (U.S. Pat. No. 5,695,164) and Covington (U.S. Pat. No. 7,006,375), has been developed, that seems to eliminate some of the problems associated with the excessive power consumption necessitated by external switching fields. The spin transfer device shares some of the operational features of the conventional MTJ cell (particularly the read process) described above, except that the switching of the free layer magnetic moment (the write process) is produced by passage of the spin polarized current itself. In this device, unpolarized conduction electrons passing through a first magnetic layer having its magnetic moment oriented in a given direction (such as the pinned layer) are preferentially polarized by their passage through that layer by a quantum mechanical exchange interaction with the polarized bound electrons in the layer. Such a polarization can occur to conduction electrons that reflect from the surface of the magnetized layer as well as to those that pass through it. The efficiency of such a polarization process depends upon the crystalline structure of the layer. When such a stream of polarized conduction electrons subsequently pass through a second magnetic layer (such as the free layer) whose polarization direction is not fixed in space, the polarized conduction electrons exert a torque on the bound electrons in the magnetic layers which, if sufficient, can reverse the polarization of the bound electrons and, thereby, reverse the magnetic moment of the magnetic layer. The physical explanation of such a torque-induced reversal is complicated and depends upon induction of spin precession and certain magnetic damping effects (Gilbert damping) within the magnetic layer (see Slonczewski, below). If the magnetic moment of the layer is directed along its easy magnetic axis, the required torque is minimized and the moment reversal occurs most easily. The use of a current internal to the cell to cause the magnetic moment reversal requires much smaller currents than those required to produce an external magnetic field from adjacent current carrying lines to produce the moment switching. Much recent experimental data confirm magnetic moment transfer as a source of magnetic excitation and, subsequently, magnetic moment switching. These experiments confirm earlier theoretical predictions (J. C. Slonczewski, J. Magn. Mater. 159 (1996) LI, and J. Z. Sun, Phys. Rev. B., Vol. 62 (2000) 570). These latter papers show that the net torque, $\Gamma$, on the magnetization of a free magnetic layer produced by spin-transfer from a spin-polarized DC current is proportional to:

$$\Gamma = s n_m x (n_s x n_m), \qquad (1)$$

Where s is the spin-angular momentum deposition rate, $n_s$ is a unit vector whose direction is that of the initial spin direction of the current and $n_m$ is a unit vector whose direction is that of the free layer magnetization and x symbolizes a vector cross product. According equation (1), the torque is maximum when $n_s$ is orthogonal to $n_m$.

Figure 2:
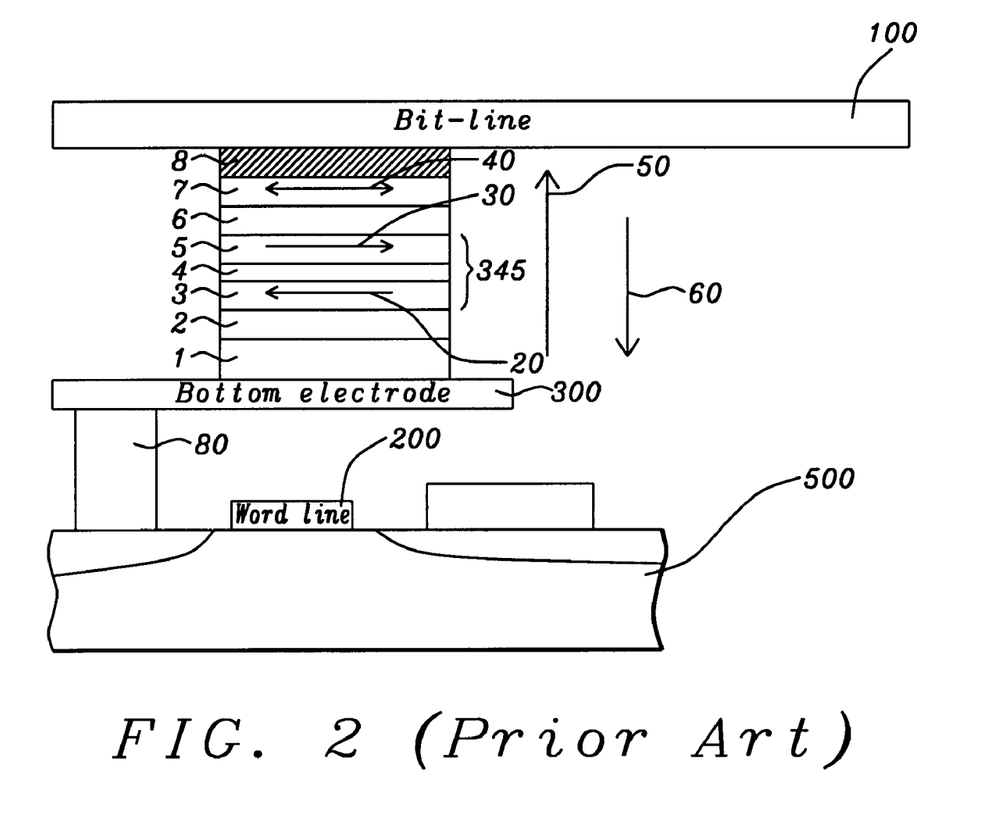
FIG. 2 is a schematic cross-sectional view of a typical prior art spin-transfer device, including an MTJ element and current providing transistor, that, in the present invention, will utilize a novel combination of a pinning layer a tunneling barrier layer and a free layer.

Referring to FIG. 2, there is shown a schematic illustration of an exemplary prior art MTJ cell element (such as that in FIG. 1) being contacted from above by a bit line (100) and from below by a bottom electrode (300). The bottom electrode is in electrical contact, through a conducting via (80), with a CMOS transistor (500) that provides current to the MTJ element when the element is selected in a read or write operation.

Moving vertically upward from bottom electrode to bit line this prior art storage device consists of an underlayer (1), which could be a seed layer or buffer layer, an antiferromagnetic pinning layer (2), a synthetic antiferromagnetic (SyAF) pinned reference layer (345), consisting of a first ferromagnetic layer (3), a non-magnetic spacer layer (4) and a second ferromagnetic layer (5), a non-conducting tunneling barrier layer (6), a ferromagnetic free layer (7) and a non-magnetic capping layer (8). Arrows, (20) and (30), indicate the antiparallel magnetization directions of the two ferromagnetic layers (3) and (5) of the SyAF pinned layer (345). The double-headed arrow (40) in free layer (7) indicates that this layer is free to have its magnetic moment directed in either of two directions.

Referring again to FIG. 2 it is noted that when a certain critical current (arrow (50) is directed from bottom to top (layer (1) to layer (8)), the free layer magnetization (40) would be switched to be opposite to the direction of the reference layer's magnetization (30) by the spin-transfer torque. This puts the MTJ cell into its high resistance state.

Conversely, if the current is directed from top to bottom (60), the free layer magnetization (40) would be switched, by torque transfer of angular momentum, to the same direction as that of the pinned reference layer's direction (30), since the conduction electrons have passed through that layer before entering the free layer. The MTJ element is then in its low resistance state.

Referring again to FIG. 2, this entire configuration represents a schematic diagram of a single spin-RAM memory cell that utilizes the spin transfer effect (denoted hereinafter as an STT-RAM) for switching an MTJ type element. In this paper, we will use the term "element" to describe the basic MTJ structure comprising a tunneling barrier layer sandwiched between ferromagnetic fixed and free layers. We shall use the term "memory cell" to denote the combination of the MTJ element incorporated within the circuitry shown that permits the element to be written on and read from. Such circuitry includes intersecting current carrying lines that allow a particular element to be accessed and also a CMOS transistor that allows a current to be injected into the element. The word line provides the bit selection (i.e., selects the particular cell which will be switched by means of a current passing through it between the bit line and the source line) and the transistor provides the current necessary for switching the MTJ free layer of the selected cell. Although it is not shown in this simplified figure, the cell is read by applying a bias voltage between the bit line and source line, thereby measuring its resistance and comparing that resistance with a standard cell in the circuit (not shown).

The critical current for spin transfer switching, $I_c$, is is generally a few milliamperes for an 180 nm sub-micron MTJ cell (of cross-sectional area A approximately A=200 nm×400 nm). The corresponding critical current density, $J_c$, which is $I_c/A$, is on the order of several $10^7$ Amperes $cm^2$. This high current density, which is required to induce the spin transfer effect, could destroy the insulating tunneling barrier in the MTJ cell, such as a layer of AlOx, MgO, etc.

The difference between an STT-RAM and a conventional MRAM is only in the write operation mechanism; the read operation is the same for both types of cell. In order for the spin transfer magnetization mechanism switching to be viable in the 90 nm MTJ cell structure and smaller, the critical current density must be lower than $10^6$ A/cm$^2$ if it is to be driven by a CMOS transistor that can typically deliver 100 μA per 100 nm of gate width. For STT-RAM applications, the ultra-small MTJ cells must exhibit a high tunnel magnetoresistance ratio, TMR=dR/R, much higher than the conventional MRAM-MTJ that uses AlOx as a tunneling barrier layer and has a NiFe free layer. Such MRAM-MTJ cells have a dR/R~40%. It has recently been demonstrated (S. C. Oh et al., "Excellent scalability and switching characteristics in Spin-transfer torque MRAM" IEDM2006 288.1 and "Magnetic and electrical properties of magnetic tunnel junction with radical oxidized MgO barriers," IEEE Trans. Magn. P 2642 (2006)) that a highly oriented (001) CoFe(B)/MgO/CoFe(B) MTJ cell is capable of delivering dR/R>200%. Furthermore, in order to have a satisfactory "read margin", TMR/($R_p$ covariance), where $R_p$ is the MTJ resistance for parallel alignment of the free and pinned layers, of at least 15 and preferably >20 is required. It is therefore essential to find a method of fabricating the CoFe(B)/MgO/CoFe(B) MTJ cell with a good read margin for read operation. Note, "$R_p$ covariance" indicates the statistical spread of $R_p$ values.

In MRAM MTJ technology, $R_p$ is as defined above and $R_{ap}$ is the MTJ resistance when the free and pinned layers have their magnetizations aligned in an antiparallel configuration. Uniformity of the TMR ratio and the absolute resistance of the cell are critical to the success of MRAM architecture since the absolute value of the MTJ resistance is compared to the resistance of a reference cell during the read operation. If the active device resistances in a block of memory show a high variation in resistance (i.e. high $R_p$ covariance, or $R_{ap}$ covariance), a signal error can occur when they are compared with the reference cell. In order to have a good read margin TMR/($R_p$ covariance), should have a minimum value of 12 and most preferably be >20.

To apply spin transfer switching to the STT-RAM, we have to decrease $I_c$ by more than an order of magnitude. The intrinsic critical current density, $J_c$, is given by Slonczewski (J. C. Slonczewski, J. Magn. Mater. 159 (1996) LI,) as:

$$J_c = 2e\alpha M_s t_F (H_a + H_k + 2\pi M_s)/\hbar\eta \quad (1)$$

where e is the electron charge, α is the Gilbert damping constant, $t_F$ is the free layer thickness, $\hbar$ is the reduced Planck's constant, η is the spin-transfer efficiency (related to the tunneling spin polarization factor of the incident spin-polarized current), $H_a$ is the external applied field, $H_k$ is the uniaxial anisotropy field and $2\pi M_s$ is the demagnetization field of the free layer. Normally the demagnetization field is much larger than the two other magnetic fields, so equation (1) can be rewritten:

$$I_c \sim \alpha M_s V/\hbar\eta, \quad (2)$$

where V is the magnetic volume, $V = M_s t_F A$, which is related to the thermal stability function term, $K_u V/k_b T$, which governs the stability of the magnetization relative to thermally-induced fluctuations.

M. Hosami ("A novel nonvolatile memory with spin torque transfer magnetization switching: Spin RAM"2005 IEDM, paper 19-1), discusses a Spin-RAM 4 Kbit array which is fabricated using a stack of the following form: CoFeB/RF-sputtered MgO/CoFeB with a MnPt pinning layer. This MTJ stack is processed using 350° C., 10 KOe annealing. The cell size is a 100 nm×150 nm oval. Patterning of such sub 100 nm oval MTJ elements is done using e-beam lithography. The tunnel barrier layer is (001) crystallized MgO whose thickness is less than 10 angstroms for the desired RA of about 20 $\Omega$-$\mu m^2$. Intrinsic dR/R of the MTJ is 160%, although under operational conditions (0.1 V bias, for read determination) it is about 100%. Using a current pulse width of 10 ns, the critical current density is about $2.5 \times 10^6$ A/cm$^2$. The amounts to a critical current of 375 $\mu$A. The distribution of write voltages for the array, for the high resistance state to the low resistance state has shown a good write margin. Resistance distributions for the high and low resistance states has a sigma ($R_p$ covariance) around 4%. Thus, under operational conditions, (TMR/$R_p$ covariance) is 25. This is equivalent to the conventional 4-Mbit CoFeB/AlOx/NiFe MTJ-MRAM in which dR/R (0.3 V biased) typically is about 20-25%. For a $R_p$ covariance=1%, TMR/($R_p$ covariance) is >20.

S. C. Oh et al., cited above, describes an STT-RAM utilizing spin torque transfer where a CoFeB/RF-sputtered MgO/CoFeB was processed with a 360° C.-10 KOe annealing. Pinning layer for the stack is MnPt. MgO thickness is controlled to less than 10 angstroms to give an RA of about 50 $\Omega$-$\mu m^2$. MRAM circuits made of sub-100 nm MTJ cells were made using conventional deep UV lithography. For the 80 nm×160 nm MRAM MTJ, $J_c$ at 10 ns pulses is about $2.0 \times 10^6$ A/cm$^2$. TMR at 400 mV bias is about 58% and the read margin, TMR/$R_p$ covariance, for 100 nm×200 nm cells is 7.5, corresponding to a $R_p$ covariance of 7.8%.

J. Hayakawa et al. ("Current—driven magnetization switching in CoFeB/MgO/CoFeB magnetic tunnel junctions, Japn. J. Appl. Phys. V 44, p. 1267 (2005)) has reported critical current densities of 7.8 and $8.8 \times 10^5$ and $2.5 \times 10^6$ with 10 ns pulse width, for MTJ cells processed with 270, 300 and 350° C. annealing. MgO barrier layer is about 8.5 angstroms thick, yielding a RA of about 10 $\Omega$-$\mu m^2$. Intrinsic MR as a function of the annealing temperature for an MTJ stack formed of $Co_{40}Fe_{40}B_{20}$/MgO/$Co_{40}Fe_{40}B_{20}$ with a 20 angstrom thick $Co_{40}Fe_{40}B_{20}$ free layer are 49, 73 and 110% respectively. It is noted that the free layer in an MTJ processed at 270 and 300° annealing temperatures is amorphous. The pinning layer for the MTJ stack was IrMn.

Y. Huai et al. ("Spin transfer switching current reduction in magnetic tunnel junction based dual spin filter structures" Appl. Phys. Lett. V 87, p 222510 (2005)) have reported on spin-transfer magnetization transfer of a dual spin valve of the following configuration:

Ta/MnPt/CoFe/Ru/CoFeB/Al$_2$O$_3$/CoFeB/Spacer/CoFe/MnPt/Ta

It is noted that the free layer of the dual structure is made of a low saturation moment (approx. 1000 emu/cm$^3$) amorphous CoFeB. The nominal MTJ size is 90 nm×140 nm. RA is about 20 $\Omega$-$\mu m^2$ and dR/R is about 20%. For a dual spin-filter (DSF) structure, the free layer experiences the spin transfer effect on both faces, so the critical current density has been reduced to approx. $1.0 \times 10^6$ A/cm$^2$.

C. Horng et al. (docket No. HMG06-042. "A novel MTJ to reduce spin-transfer magnetization switching current") is assigned to the same assignee (Magic Technologies) as the present invention and fully incorporated herein by reference. Horng et al. have produced an STT-MTJ test structure that includes a MTJ stack of the form:
Ta/NiCr/MnPt/Co$_{75}$Fe$_{25}$/Ru7.5/Co$_{60}$Fe$_{20}$B$_{20}$—Co$_{75}$Fe$_{25}$/(NOX)MgO11/Co$_{60}$Fe$_{20}$B$_{20}$/Ta Which is processed at 265° C.-2 hrs-10 KOe annealing, so that the Co$_{60}$Fe$_{20}$B$_{20}$ remains amorphous. It is noted that the pinning layer is MnPt. RA of the MTJ is controlled to less than 10 $\Omega$-$\mu m^2$ and intrinsic dR/R is about 100%. For the 100 nm×150 nm size MTJ, patterned using conventional photo-lithography of the 180 nm node technology, dR/R at 0.1 V bias is about 70-80%. Due to the fact that no array was constructed, there was no determination of $R_p$ covariance. However, the covariance for a conventional MRAM of the same basic MTJ structure, but 200 nm×325 nm was measured to about 3.5%. Extrapolation to the 100 nm×150 mn size of the STT-MTJ predicts that the covariance would be about 7%. This value would not be sufficient to provide a good read margin.

The TMR sensor currently under production at Headway Technologies uses an MTJ element of the form:
Ta/Ru/IrMn/CoFe/Ru/CoFeB/CoFe/MgO/CoFe—NiFe/NiFeHf In this configuration, the pinning layer is IrMn. TMR sensor size when the resistance measurements are made (i.e., untapped) is 100 nm×500 nm. Patterning is done using conventional photo-lithography of the 180 nm node technology. $R_p$ covariance across the 6" wafer for that sensor size is about 3%. Scaling to a 100 nm×150 nm size, the covariance is projected to be about 5%.

It should be noted that to obtain improvement in $R_p$ covariance, the photo-lithography using the 65-90 nm node technology, as is now practiced in semiconductor technology, would be viable.

C. Bilzer et al. ("Study of the dynamic magnetic properties of soft CoFeB films", J. Appl. Phys. V 100, 053903 (2006)) has measured the magnetization damping parameters for the ion-beam deposited Co$_{72}$Fe$_{18}$B$_{10}$ film as a function of film thickness and crystalline state. Amorphous Co$_{72}$Fe$_{18}$B$_{10}$ showed low damping with a between 0.006 and 0.008, which was thickness independent. Crystalline Co$_{80}$Fe$_{20}$ shows a damping factor that is approximately a factor of 2 higher.

Figure 6:
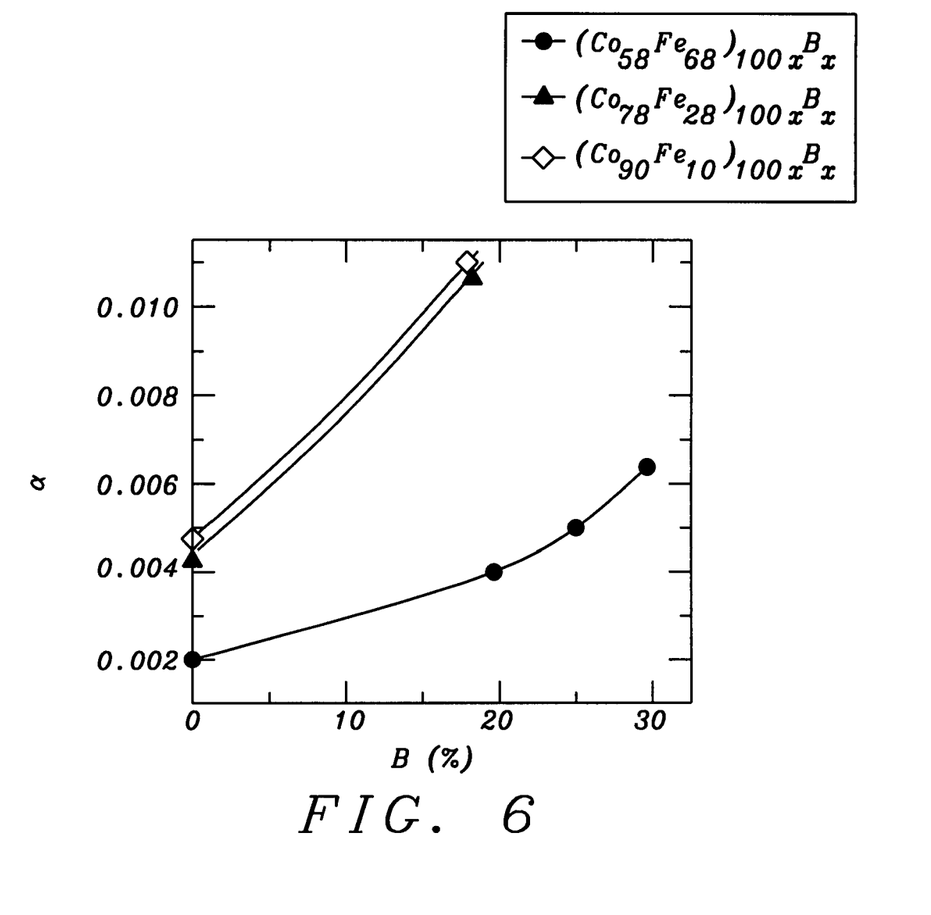
FIG. 6 is a graphical illustration of the distribution of Gilbert damping factors for various ternary compositions of Fe—Co—Ni alloy films.
Figure 7:
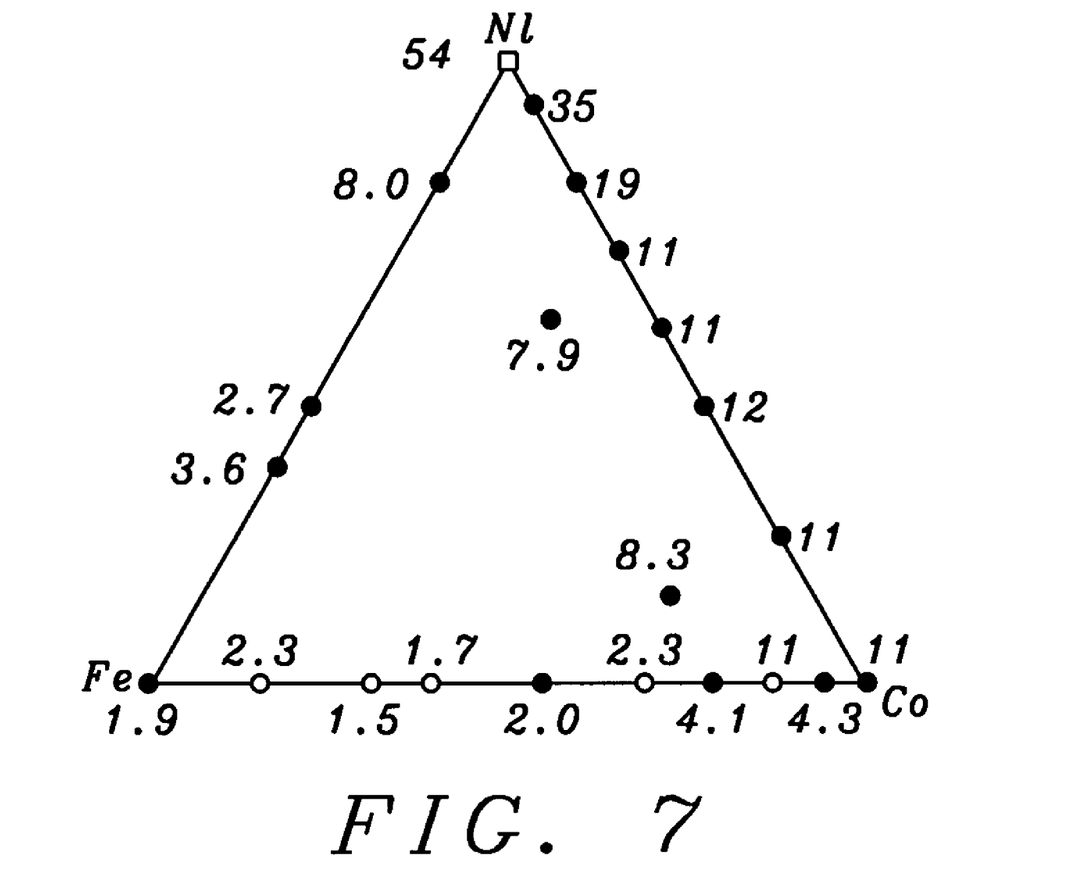
FIG. 7 is a graphical illustration of the variation of the Gilbert damping factor for Co—Fe—B films of various compositions.

M. Oogane et al. ("Magnetic damping in ferromagnetic thin film", Japn. J. Appl. Phys. V 45, p3889 (2006)) have measured the Gilbert damping factor for the ternary Fe—Co—Ni and CoFeB films. As shown in FIG. 6, a low damping constant is measured for the Fe rich FeCo and the Fe—Ni binary alloys. For the CoFeB alloys, as shown in FIG. 7, the damping constant is 0.0038 and 0.010 respectively for amorphous Co$_{40}$Fe$_{40}$B$_{20}$ and Co$_{60}$Fe$_{20}$B$_{20}$.

The above prior art tends to imply that:
1. $J_c$ is greater than $2 \times 10^6$ A/cm$^2$ for the CoFeB/MgO/CoFeB MTJ with a crystalline CoFeB free layer.
2. $J_c$ less than $1.0 \times 10^6$ A/cm$^2$ is achievable for the CoFeB/MgO/CoFeB MTJ with an amorphous CoFeB free layer.
3. The $R_p$ covariance for an STT-RAM MTJ made, using conventional 180 nm node photo-lithography, with an MnPt (pinning)/CoFe(B)MgO/CoFeB structure is greater than or equal to 7.5%, while a covariance that is less than or equal to 5% may be achievable for the MTJ with an IrMn pinning layer.
4. A low damping factor free layer is critical for reducing the spin-torque magnetization switching current.

An examination of the patented prior art shows an increasing number of inventions utilizing the STT approach to MRAM switching. Although this prior art describes many different MTJ stack configurations and layer materials, none of them address the particular combination of conclusions that we have drawn and that are listed above in 1 through 4.

Shimazawa et al. (US Patent Application 2007/0086120), Ashida et al. (US Patent Application 2007/0076469) and Huai et al. (US Patent Application 2006/01022969) all teach an AFM layer comprising IrMn.

Nguyen et al. (U.S. Pat. No. 6,958,927) and Huai et al. (U.S. Pat. No. 7,126,202) teach that a first AFM layer is preferably IrMn.

Huai et al. (U.S. Pat. No. 6,967,863) discloses that an AFM layer is preferably IrMn or PtMn.

Huai et al. (U.S. Pat. No. 7,106,624) states that the AFM is preferably PtMn but "nothing prevents" the use of IrMn instead.

Covington (U.S. Pat. No. 7,006,375) shows a pinned layer that can be either IrMn or PtMn.

Pakala et al. (US Patent Application 2006/0128038) discloses that seed layers may be used to provide a desired texture to the AFM layer. For example, if IrMn is used as the AFM layer, then a TaN layer should be used.

The present invention will describe a spin transfer MRAM device in which a new form of free layer, combined with an IrMn pinning layer will address the issues raised above in statements 1-4.

SUMMARY OF THE INVENTION

A first object of the present invention is to provide an MTJ element for an STT-MRAM cell wherein the critical current for magnetization switching by spin-torque transfer (STT) is lowered.

A second object of this invention is to provide a MTJ element for an STT-RAM configured MRAM device in which the intrinsic (unbiased) and operational (biased) TMR ratio, dR/R, is significantly enhanced and wherein the intrinsic dR/R is between about 125% to 130%.

A third object of the present invention is to provide such a device in which the product RA, of MTJ resistance (R) and MTJ element cross-sectional area (A) is less than a certain amount, preferably less than 10 $\Omega$-$\mu m^2$.

A fourth object of the present invention is to provide a MTJ element patterned using standard 180 nm photo-lithography and corresponding STT-RAM configured MRAM array of such elements, wherein the statistical distribution of MTJ resistances has a low covariance, preferably less than 5%.

A fifth object of the present invention is to provide a MTJ element and corresponding STT-RAM configured MRAM array of such elements, wherein the read margin, (TMR/$R_p$ covariance), is greater than 15, and for an element of cross-sectional area 100 nm×150 nm is at least 20.

A sixth object of the present invention is to provide such an MTJ element wherein the structure of the pinning/pinned layer provides a low angular dispersion of the pinned layer magnetic moment direction, preferably 1.6× less than that of conventional configurations.

These objects will be met by an MTJ element structure in which the free layer damping constant (Gilbert damping constant $\alpha$) is reduced to less than that associated with only a free layer of amorphous CoFeB, in which the tunnel barrier layer is deposited in a crystalline form by means of being sputtered from an Mg target and then naturally oxidized, in which highly efficient and enhanced spin polarization is obtained by surrounding the free layer by layers of crystalline Fe and in which the antiferromagnetic pinning layer is a layer of MnIr.

The preferred structure of the MTJ element is of the form: Buffer layer/Pinning layer//$Co_{75}Fe_{25}$23/Ru7.5/ $Co_{60}Fe_{20}B_{20}$15-$Co_{75}Fe_{25}$(API)/Mg8-NOX—Mg4/Fee layer/Ta30Ru Where the general ordering of the layers is as in FIG. 2. In the preferred embodiment, the free layer is of the form Fe 3/CoFeB 20/Fe 6, with the two interfacial Fe layers being very thin (respectively 3 and 6 angstroms) and crystalline in structure for enhanced spin polarization of the current, while the CoFeB layer sandwiched between them is amorphous in form to obtain a low Gilbert magnetic damping factor. The tunneling barrier layer is a layer of MgO that is rendered crystalline in nature by being formed by a combination of a sputtering deposition of Mg and a natural oxidation process. The sputtering is onto an exposed surface of AP1 that has been preconditioned by a plasma treatment to render it smooth/flat. This plasma pretreatment is, in turn, highly advantageous, given the fact that the pinning layer for the SyAF pinned layer is a layer of MnIr rather than the more usual MnPt. The MnIr pinning layer, in turn, allows an advantageous annealing process in which the anneal need only be carried out at 265° C. for between 1 and 2 hours in a magnetic field of 10 K Oe. It is to be noted that other prior art processes form the MgO tunneling barrier layer by sputtering directly from an MgO target. This produces an amorphous layer which must be rendered crystalline by use of much higher annealing temperatures than are required in the present invention.

DESCRIPTION OF THE PREFERRED EMBODIMENTS

The preferred embodiment of the present invention is an STT-RAM memory cell and an array of such cells, in which each cell incorporates an MTJ element that operates in the spin torque transfer (STT) mode. The MTJ element includes an IrMn pinning layer, an SyAP pinned layer, a crystalline barrier layer of naturally oxidized MgO and a crystalline-Fe-sandwiched CoFeB free layer having Gilbert damping constants that are lower than those associated with free layers of only amorphous CoFeB.

The preferred MTJ stack configuration is:
BE/NiCr50/Ru20/MnIr70/$Co_{75}Fe_{25}$23 (AP2)/Ru7.5/ $CoFeB_{20}$—$Co_{75}Fe_{25}$6-7 (AP1)/PT/Mg8-NOX—Mg4/ Fe3-$Co_{60}Fe_{20}B_{20}$20-Fe6(FL)/Ta Referring to FIG. 3a, FIGS. 3b and 3c, there will be schematically shown the process steps by which the stack configuration is formed. We will retain the essential elements of the numbering of FIG. 2.

Figure 3A:
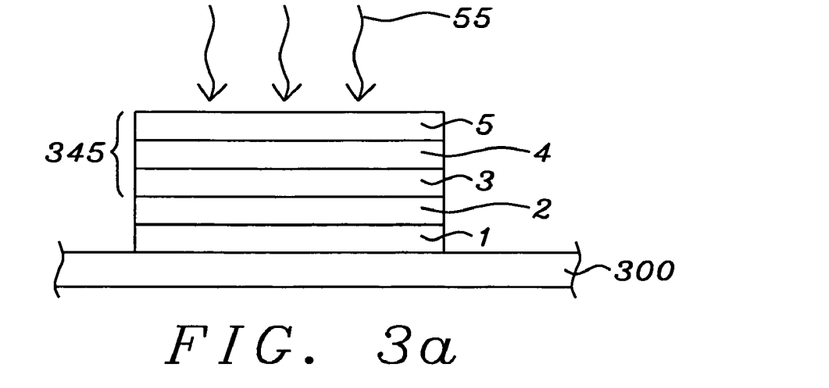
FIG. 3a, FIG. 3b and FIG. 3c are schematic views of the fabrication of the layer structure of a preferred embodiment of the present invention

Referring first to FIG. 3a, there is shown the structure labeled BE above, which denotes a bottom conducting line or electrode (300). Layer (1) is a layer of NiCr, which is a seed layer. Layer (2) is the pinning layer, which is a layer of MnIr of 70 angstroms thickness. Layer (345) is the configuration $Co_{75}Fe_{25}23(AP2)/Ru7.5/CoFeB_{20}$—$Co_{75}Fe_{25}6-7$ (AP1) is a synthetic antiferromagnetic (SyAF) pinned layer, where AP1 (5) and AP2 (3) denote the two ferromagnetic layers magnetized in antiparallel directions and exchange coupled by the layer of Ru (4). As we shall explain below, PT denotes a plasma treatment (55) that is applied to the upper surface of AP1 and is required to produce the desired objects of the invention.

Figure 3B:
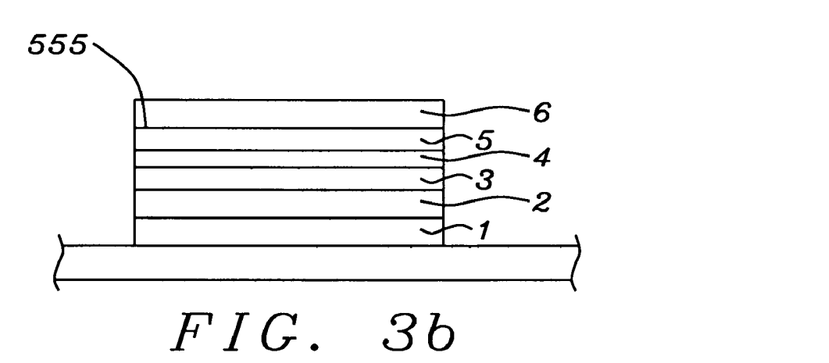

Referring next to FIG. 3b, there is shown the formation of an MgO (or, similarly, an AlOx) barrier layer (6) on the plasma treated surface (555) of AP1. The plasma treatment, which smoothes and renders flat the (555) surface, is required because layers formed on a MnIr/SyAF combination such as in the present invention are typically rougher than when formed on an MnPt/SyAF combination. Consequently, dR/R and $H_e$ ($H_{in}$) pf the MnIr MTJ are not as good as that for the MnPt MTJ. To yield high dR/R and low $H_{in}$, the CoFe(B)/MgO/CoFeB interfaces must be smooth. This is particularly true for the MTJ configuration where the very high dR/R is a result of coherent spin-dependent tunneling through the (001) CoFe(B)/(001)MgO/(001)CoFe(B) MTJ junctions.

To prepare a smooth/flat bottom electrode (the bottom electrode denoting the entire portion of the element below the MgO tunneling barrier layer) prior to the MgO deposition, the plasma treatment (PT) process (55) has been applied to the exposed surface of AP1. PT is a low power (20 W) Ar ion-milling process that smoothes and flattens the AP1 surface. The ion energy is sufficiently low so that it does not damage the surface.

Referring again to FIG. 3b, the MgO barrier layer (6) is made by a process indicated above by Mg8-NOX—Mg4 and which is more fully described by Horng et al cited above. Unlike prior art processes, in which a target of MgO is sputtered and thereby produces an amorphous MgO layer, in the present process an Mg target is sputtered to produce a crystalline Mg layer and that already crystalline layer is then naturally oxidized after deposition to directly produce a crystalline MgO layer. A subsequent second Mg sputtering process completes the layer formation as described by Horng. In its as-deposited state, the naturally oxidized Mg already has a highly oriented (001) crystalline plane texture. In this respect, prior art rf-sputtered (extra-thin) MgO is deposited in an amorphous state and has to rely on subsequent high temperature (>350° C.) annealing processing to obtain a highly oriented (001) structure. Such high temperature annealing is not required in the present invention.

Figure 3C:
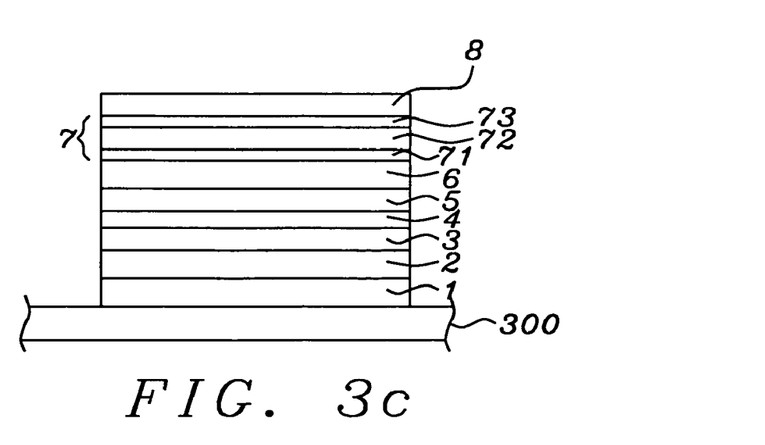

Referring now to FIG. 3c, there is shown the formation of the free layer of the present invention. The free layer (7) of the configuration above is a composite layer made of an atomic layer thickness (approximately 3 angstroms) crystalline Fe interface layer (71) and thicker, amorphous layer (72) of $Co_{60}Fe_{20}B_{20}$ (approximately 20 angstroms) formed upon it. More preferably, as is shown in the figure, an additional crystalline layer (73) of Fe approximately 6 angstroms in thickness can be inserted between the $Co_{60}Fe_{20}B_{20}$ and the Ta 30 capping layer (8). These two layers of Fe provide advantageous enhanced electron polarization properties at the interfaces between the MgO layer (6) and the free layer (7), between the AP1 layer (5) and the MgO layer (6) and between the free layer (7) and the Ta layer (8). Finally, it is also noted from the evidence of FIG. 7 that a crystalline structure free layer of the form Fe(rich)-Co/Fe(rich)-Ni, which is a bilayer of two binary alloys that are rich in Fe, such as FeCo/FeNi can produce an even lower damping factor than the Fe/CoFeB/Fe free layer with amorphous CoFeB shown in the present FIG. 3c and, in addition, when subjected to a >300° C. (e.g. 350° C.) post annealing can yield a dR/R=200% and a corresponding read margin that is >25. Such a free layer will, therefore, produce another preferred embodiment of the present invention.

For comparison, we also made an STT-MTJ element in the configuration of Horng et al., in which the pinning layer is MnPt and the free layer is only amorphous $Co_{60}Fe_{20}B_{20}$, without the interfacial layers of Fe. To obtain the amorphous $Co_{60}Fe_{20}B_{20}$ layer the MTJ stack is processed using an (250-265° C.)-10 KOe (1-2 hour) annealing treatment. Magnetic properties of the stack configurations are displayed in the table of FIG. 4. It has already been noted here and will be discussed below, that forming the $Co_{60}Fe_{20}B_{20}$ on the atomic layer of Fe produces a higher degree of electron spin polarization than the amorphous layer alone.

Referring again to FIG. 4 there is seen a table setting forth the magnetic properties of 7 MTJ stack configurations having the general form:
Buffer layer/Pinning layer//$Co_{75}Fe_{25}23/Ru7.5/Co_{60}Fe_{20}B_{20}15$-$Co_{75}Fe_{25}$(AP1)/Mg8-NOX—Mg4/Fee layer/Ta30/Ru Row 1 shows the properties of the reference MTJ stack in which the pinning layer is MnPt and the free layer lacks the Fe crystalline layer and consists only of the amorphous CoFeB layer. Row 3 shows a similar structure except that the pinning layer is MnIr and the free layer includes the crystalline Fe layer. MR for row 1 is 103%, while for row 3 it is 118%. This improvement is attributed to the (001) Fe crystalline interface layer in the free layer structure.

Figure 4:
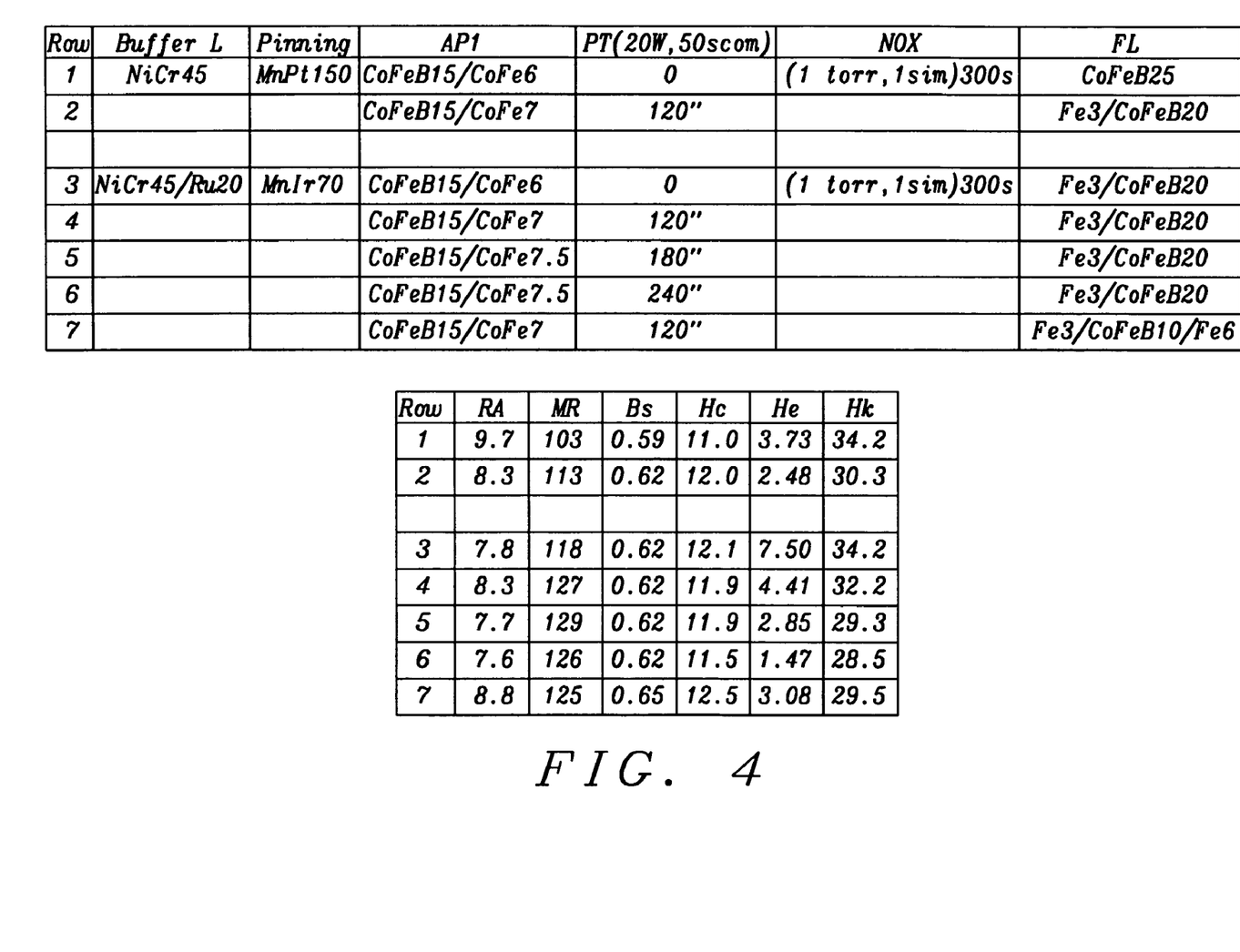
FIG. 4 is a table showing the magnetic performance properties of various MTJ configurations.

Due to a rougher bottom electrode, $H_e$ ($H_{in}$) for the MnIr-MTJ is 7.60 Oe, a twofold increase over the value of 3.73 Oe for the MnPt MTJ of the reference structure. Row 2 and Row 4, which include a 120 sec. plasma treatment (PT) of the AP1 surface, show that $H_e$ of both the MnPt and MnIr TMJ have been reduced to 2.48 and 4.41 Oe respectively. Having smooth/flat interfaces at the AP1/MgO/free layer enhances the MR for both the MnPt and MnIr structures. For 100 nm×150 nm MTJ elements, MR (at 0.1 V bias read operation) for the MnIr MTJ would be about 100%. To meet the read margin requirement of TMR/($R_p$ covariance)>20, the covariance would have to be less than or equal to 5%.

To obtain an amorphous CoFeB layer for its low magnetization damping and low $M_s$, the deposited MTJ stack is annealed using a 265° C. (1-2 hrs)10 K Oe process. Previously, in GMR sensor head fabrication, to obtain a robust MnPt/SyAF pinned layer, post deposition annealing to the MTJ stack was done in a 280° C. (5 hrs)-10 K Oe process. Post deposition annealing for the MnIr/SyAF MTJ, however, is at 250°-265° C. (5 hrs)-10 K Oe. It appears that the 265° C. (1-2 hrs)10K Oe process is more suitable for the MnIr pinning layer structure than for the MnPt pinning structure. In terms of TMR magnetic performance, the MnIr MTJ element is preferred.

Figure 5A:
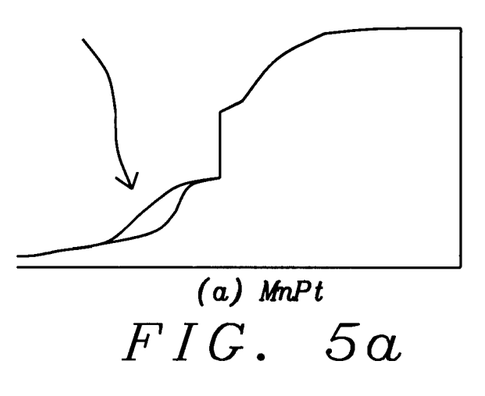
FIG. 5a and FIG. 5b are graphs showing characteristic B-H plots for an MTJ element incorporating an MnPt pinning layer (FIG. 5a) and an MnIr pinning layer (FIG. 5b).
Figure 5B:
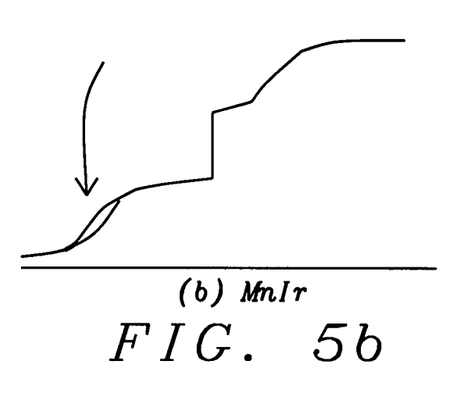

Referring now to FIGS. 5a and 5b, there is shown the B—H characteristic plots for the MTJ element made (in 5a) for the MnPt pinning layer and (5b) for the MnIr pinning layer. The open loop portion of each curve (arrows) allows us to deduce the pinned layer dispersion and the strength of the pinning field for the MnIr MTJ and for the MnPt MTJ. Thus the ratio of $H_{pin}$(MnIr)/$H_{pin}$(MnPt) is approximately 1.6. The ratio of dispersion (MnPt)/dispersion (MnIr) is about 1.6. From this, we can also deduce that the covariance ratio of [$R_p$ cov. (MnPt)/$R_p$ cov (MnIr)] is about 1.6. Using [$R_p$ cov. (MnPt)]= 7.5% given by Horng et al, we can deduce that [$R_p$ cov. (MnIr)]=4.7%, which is in close agreement to Headway Technology's measured MnIr stack covariance for their TMR sensor made with a MnIr pinning layer (described above).

Referring to FIG. 6, it is noted that the boron (B) doping to the CoFe free layer has enhanced the magnetization damping. Use of the Fe crystalline interface layers provides high spin polarization (higher than from the amorphous CoFeB layer alone). As can be seen in FIG. 7, the damping constant of Fe is $\alpha=0.0019$ and the damping constant of $Co_{60}Fe_{20}B_{20}$ is $\alpha=0.01$. The effective damping constant for the composite free layer of $Fe/Co_{60}Fe_{20}B_{20}/Fe$ (with the thicknesses of the two Fe layers being approximately 3 and 6 angstroms respectively and the thickness of the $Co_{60}Fe_{20}B_{20}$ being approximately 20 ang.) is calculated to be $\alpha=0.006$, which will produce the required improvement of the critical current for magnetic moment switching. It is further noted that an even smaller damping constant can be obtained using a free layer of $Fe/Co_{40}Fe_{40}B_{20}/Fe$ (same Fe thicknesses, but the sandwiched layer of CoFeB being approximately 15 angstroms) since the damping constant of $Co_{40}Fe_{40}B_{20}$ is $\alpha=0.0038$, which is smaller than the $\alpha=0.01$ of the $Co_{60}Fe_{20}B_{20}$.

As is finally understood by a person skilled in the art, the preferred embodiments of the present invention are illustrative of the present invention rather than limiting of the present invention. Revisions and modifications may be made to methods, materials, structures and dimensions employed in forming and providing a CPP STT-MTJ MRAM cell, said cell using transfer of spin angular momentum, while still forming and providing such a cell and its method of formation in accord with the spirit and scope of the present invention as defined by the appended claims.

What is claimed is:

1. An STT-MTJ MRAM cell operating in a CPP configuration and utilizing the transfer, by torque, of conduction electron spin angular momentum to change a free layer magnetization direction, comprising:

a substrate; an MTJ element formed on said substrate, said MTJ element comprising a vertically stacked lamination of horizontal parallel layers including, therein, in the following order:

an antiferromagnetic pinning layer formed of MnIr, an SyAP pinned layer processed by a plasma process to have a smooth/flat interfacial surface, a tunneling barrier layer formed on said smooth/flat interfacial surface, said tunneling barrier layer having a crystalline structure and comprising a naturally oxidized, sputtered layer of Mg, a ferromagnetic free layer formed on said tunneling barrier layer, said ferromagnetic free layer having a low magnetic damping factor and producing enhanced polarization of conduction electrons, and a capping layer formed on said ferromagnetic free layer, and wherein said ferromagnetic free layer is a laminate further comprising at least one interfacial layer of crystalline ferromagnetic material and an amorphous ferromagnetic layer formed thereon and whereby, a current of conduction electrons in the vertical direction can change the direction of magnetization of said ferromagnetic free layer relative to the magnetization direction of said SyAP pinned layer by means of a torque exerted on said magnetization by the electron spins characterizing said current.

2. The cell of claim 1 wherein said ferromagnetic free layer is a composite bilayer comprising a crystalline layer of Fe of approximately 3 angstroms thickness on which is formed an amorphous layer of $Co_{60}Fe_{20}B_{20}$ of approximately 20 angstroms thickness.

3. The cell of claim 2 wherein said crystalline layer of Fe is formed with an (001) crystal plane parallel to its plane of formation.

4. The cell of claim 1 wherein said tunneling barrier layer is a crystalline layer of naturally oxidized, sputtered Mg formed to a thickness of approximately 12 angstroms.

5. The cell of claim 1 wherein said antiferromagnetic pinning layer of IrMn is formed to a thickness of approximately 70 angstroms.

6. The cell of claim 1 wherein said SyAP pinned layer comprises a layer of $Co_{75}Fe_{25}$ formed to a thickness of approximately 23 angstroms, on which is formed a layer of Ru to a thickness of approximately 7.5 angstroms, on which is formed a bilayer comprising a layer of $Co_{60}Fe_{20}B_{20}$ of approximately 15 angstroms thickness on which is formed a layer of $Co_{75}Fe_{25}$ of between approximately 6 and 7 angstroms thickness.

7. The cell of claim 1 wherein said substrate is a bottom electrode and said capping layer is electrically contacted by a bit line.

* * * * *